United States Patent
Olmer

(10) Patent No.: US 6,218,304 B1
(45) Date of Patent: Apr. 17, 2001

(54) METHOD OF DETERMINING COPPER REDUCTION ENDPOINT IN THE FABRICATION OF A SEMICONDUCTOR DEVICE

(75) Inventor: Leonard J. Olmer, Orlando, FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/383,006

(22) Filed: Aug. 25, 1999

(51) Int. Cl.⁷ ...................................... H01L 21/44
(52) U.S. Cl. ................................. 438/687; 438/4
(58) Field of Search ................ 438/4, 584, 687, 438/597, 7

(56) References Cited

U.S. PATENT DOCUMENTS 4,842,891 * 6/1989 Miyazaki et al. .
6,010,749 * 1/2000 Goldman .

OTHER PUBLICATIONS

Yasushi Sawada, Hiroshi Tamaru, Masuhiro Kogoma: Motoaki Kawase and Kenji Hashimoto: The Reduction of Copper Oxide Thin Films with Hydrogen Plasma Generated by an Atmospheric–Pressure Glow Discharge; Appl. Phys. 29 (1996); pp. 2539–2544.

* cited by examiner

*Primary Examiner*—Charles Bowers
*Assistant Examiner*—Evan Pert

(57) ABSTRACT

The present invention provides a method of determining an endpoint of a reduction reaction of a metal deposited on a semiconductor wafer. The method comprises reducing an oxidized portion of the metal by subjecting the oxidized portion to a reducing agent that forms a reduction by-product and detecting the endpoint of the reduction reaction by monitoring a physical characteristic of either the reducing agent or the reduction by-product. This method is, therefore, particularly applicable in the fabrication of an integrated circuit device, such as a CMOS transistor, an NMOS transistor, a PMOS transistor, or a bi-polar transistor.

27 Claims, 2 Drawing Sheets

METHOD OF DETERMINING COPPER REDUCTION ENDPOINT IN THE FABRICATION OF A SEMICONDUCTOR DEVICE

TECHNICAL FIELD OF THE INVENTION

The present invention is directed, in general, to a method of fabricating a semiconductor device and, more specifically, to a method of determining an endpoint of a reduction reaction in the fabrication of a semiconductor device.

BACKGROUND OF THE INVENTION

In semiconductor integrated circuits, the formation of metal interconnect layers is important to the proper operation of such devices. These metal interconnect signal lines connect to lower conductive layers and "active" device regions of the integrated circuit through vias or through contact windows. Metal interconnect lines also serve as lines or runners on surface layers of integrated circuits to connect to other device areas. For best operation of the device, the metal must have sufficient conductivity to carry the electric signal and at the same time possess the ability to adhere to adjacent layers.

As the semiconductor industry attempts to reduce line widths to create smaller, faster devices, new materials will be used to overcome many of the physical limitations required by these reduced line widths. To overcome the interconnect resistance and improve electromigration resistance, many semiconductor manufacturers are turning to copper for the metal layers. However, in the past the use of copper in semiconductor devices has been limited. Copper atoms will readily diffuse through silicon causing contamination problems that cause leakage currents at p-n junctions, failure of dielectric layers, and deterioration of carrier lifetime. Therefore, unsuccessful containment of copper can have fatal effects on a semiconductor device. Copper is also subject to reaction with atmospheric oxygen or moisture during the formation of metal layers and interconnect lines. Such adverse reactions form undesirable compounds having lower conductivity and poor adhesion to other materials used in semiconductor fabrication. Accordingly, copper processing technology is an extremely important and new problem for the semiconductor industry.

To form suitable interconnects, copper metal surface layers formed on the semiconductor device must be free of any oxidized regions. Once the copper metal layer is formed and subject to an oxidizing environment, such as air, the resulting oxidized areas must be reduced back to unoxidized copper or subsequent layers will not adhere. Therefore, the subsequent process must first have an oxide reduction step where the copper layers and interconnects are subjected to a copper reduction reaction to convert any oxidized portion back to copper metal. Such reduction processes must be carefully controlled. Incomplete reduction results in a metal surface containing residual oxidized portions. Yet, if the reaction is allowed to proceed too long, the surface of the metal layers or interconnects become pitted. In either case, the performance of the device is adversely affected. Therefore, conditions that result in removal of the oxide regions without related pitting must be determined.

To solve the problems associated with reduction of oxidized copper on layers and interconnects, several approaches can be used. Currently, conditions for producing suitable copper metal surfaces and interconnects are determined manually. After a time the device is inspected to determine if the reduction is complete. The process is repeated until all oxide is removed. However, determining the endpoint of the reduction reaction in this way is both time consuming and expensive.

Accordingly, what is needed in the art is an automated method for detecting the endpoint of a reduction reaction in the fabrication of a semiconductor device. The method of the present invention addresses these needs.

SUMMARY OF THE INVENTION

To address the above-discussed deficiencies of the prior art, the present invention provides a method of determining an endpoint of a reduction reaction of a metal deposited on a semiconductor wafer. In a preferred embodiment, the method comprises reducing an oxidized portion of the metal by subjecting the oxidized portion to a reducing agent that forms a reduction by-product and detecting the endpoint of the reduction reaction by monitoring a physical characteristic of either the reducing agent or the reduction by-product. This method is, therefore, particularly applicable in the fabrication of an integrated circuit device, such as a CMOS transistor, an NMOS transistor, a PMOS transistor, or a bi-polar transistor.

Thus, in a broad scope, the present invention provides a method of easily and quickly detecting when an oxidized portion of a metal has been removed from the surface of the semiconductor wafer, which reduces both the time required to monitor such processes and the cost associated with integrated circuit fabrication. Moreover, the present invention provides more accurate control over the oxidation process, which produces an integrated circuit device having fewer defects.

In one embodiment, the step of reducing an oxidized portion of the metal includes reducing a copper oxide, which in certain applications may be copper (II) oxide, $Cu_2O$. Thus, with the increased use of copper, the present invention has substantial application in present integrated circuit fabrication processes.

In yet other aspects of the present invention, the metal may be reduced with ammonia. The reduction reaction reduces the oxidized portions of the metal to form by-products. In one example, the by-product comprises a gaseous species, such as water. However, other gaseous species produced by the reduction reaction may be monitored as well.

One way in which the endpoint can be detected is with a spectrophotometer. The range of frequency may vary, but one particular range is the ultraviolet light frequency. In such instances, the spectrophotometer is preferably an infrared spectrophotometer, and more specifically is an UV-visible spectrophotometer. As previously stated, a physical characteristic of either the reducing agent or the reduction reaction by-products may be monitored. As such, in one embodiment detecting an endpoint includes monitoring a physical characteristic of the reducing agent, and another embodiment provides that detecting an endpoint includes monitoring a physical characteristic of the reaction by-product.

In another aspect, the present invention provides a method of fabricating a semiconductor device, such as an integrated circuit device. This particular method includes forming active device regions on a semiconductor wafer, forming a metal within the semiconductor device wherein an oxidized surface forms on the metal surface during an intermediate phase of the fabrication of the semiconductor device reducing the oxidized portion by subjecting the oxidized portion to a reducing agent that forms a reduction by-product, detecting an endpoint of the reduction reaction by monitoring a physical characteristic of either the reducing agent or the reduction by-product, and completing the fabrication of the semiconductor device. Accordingly, this particular embodiment is particularly useful in fabricating a semiconductor device, which preferably includes an integrated circuit, such as a CMOS transistor, an NMOS transistor, a PMOS transistor, or a bi-polar transistor.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
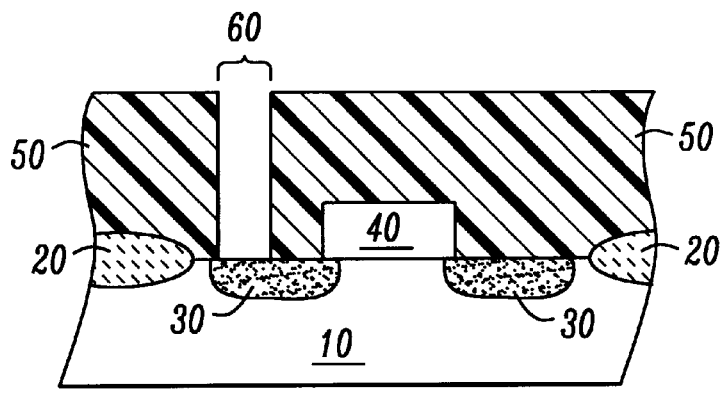
FIG. 1 illustrates a generic semiconductor device opening or via to contact an active region of the substrate.

Referring initially to FIG. 1, a semiconductor device is formed on a semiconductor substrate 10, which may comprise materials known to those skilled in the art such as silicon or gallium arsenide. Although a substrate 10 is described, it will be apparent to those skilled in the art that the described technique may be used with a contact formed anywhere within a semiconductor wafer. The term "within" includes interior layers and regions as well as surface or exterior layers and regions of the semiconductor wafer. It is understood also that a semiconductor device includes but is not limited to transistors, capacitors, inductors and any bond pads required to connect to external devices and circuits.

The first step in creating such a device is the formation of the desired pattern of dielectric isolation, or field oxide regions 20. Active regions 30 of the substrate must also be formed as well as elements of the device such as gate 40. Detailed processes for formation of field oxide regions, active regions, and devices are well known to those skilled in the art.

A dielectric layer 50, such as silicon dioxide ($SiO_2$), that has a thickness which varies from device to device, depending on the application, is formed over the field oxide 20 and active regions 30, and an opening (via or contact window) 60 is formed therethrough using a mask and subsequent etching technique as known in the art.

Figure 2:
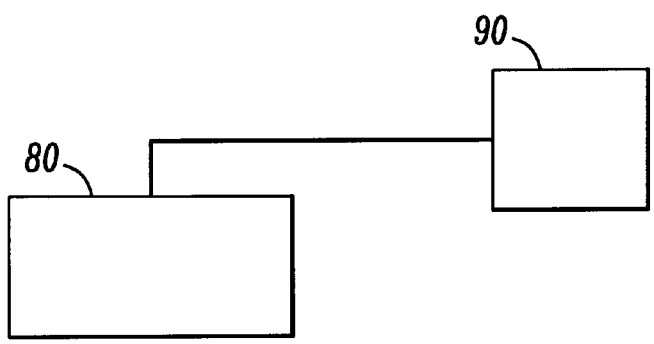
FIG. 2 illustrates a semiconductor device having a metal contact plug formed on the active region of the substrate.
Figure 2:
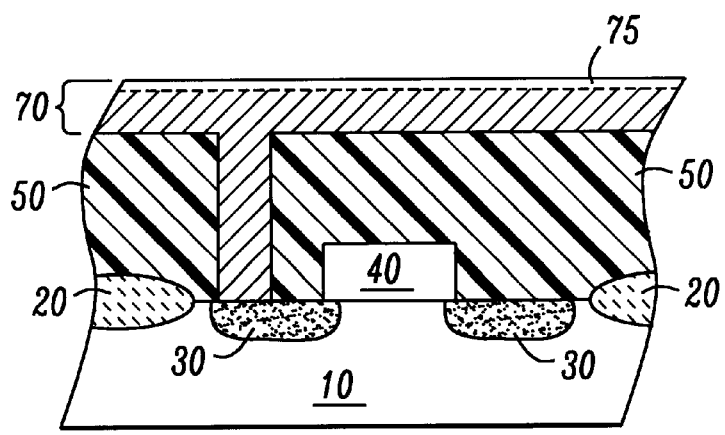

As illustrated in FIG. 2, a layer of conductive material 70 is then formed on the dielectric layer 50, filling the opening 60. The conductive material 70 is susceptible to oxidation. Particularly useful examples include scandium, titanium, zirconium, hafnium, vanadium, niobium, and tantalum. In one embodiment conductive material is copper. The purpose and function of the conductive layer is well known in the art and serves as an interconnect or runner that electrically connects different devices in the semiconductor device.

Upon formation of the conductive layer 70, portions of the conductive layer 70 are oxidized to form the oxidized, metal-containing layer 75, preferably comprises copper oxide and more preferably comprises cupric oxide ($Cu_2O$). However, because such oxidized portions adversely affect the functionality of the device, these oxidized portions 75 are subjected to a reduction process that restores their functionality. The reduction process preferably produces a reaction by-product that can be monitored. A particularly advantageous example employs ammonia as the reducing agent. However, any reducing agent, whether it be a single chemical or a combination of chemicals, that reduces the oxidized portions 75 and produces a by-product that can be monitored is within the scope of the present invention.

During the reduction reaction, the oxidized portions are reduced and by-products are formed. In one embodiment the by-products comprise gaseous species. Therefore, the reduction reaction is carried out at temperatures and pressures where one or more by-products is in the gas phase. In a particularly useful embodiment a gaseous by-product is water. The reduction reaction is monitored by monitoring a physical characteristic of the reduction by-product over the course of the reaction, where the reaction by-product may be a single chemical or many chemical species. One skilled in the art recognizes that various spectroscopic techniques will be useful in monitoring a physical characteristic of one or more by-products. For example, in one advantageous embodiment, the monitored physical characteristic is the infrared spectrum, which can be measured by a device 80, such as a spectrophotometer. Preferably, the spectrophotometer is an UV-visible spectrophotometer. The device 80 is best used in conjunction with a controller 90, which can either be built into the device 80 or electrically connected to it as shown in FIG. 2. The controller 90 is preferably a computer that has sufficient central processing capabilities and memory capacity to provide accurate data relating to the reduction reaction's endpoint.

Figure 3:
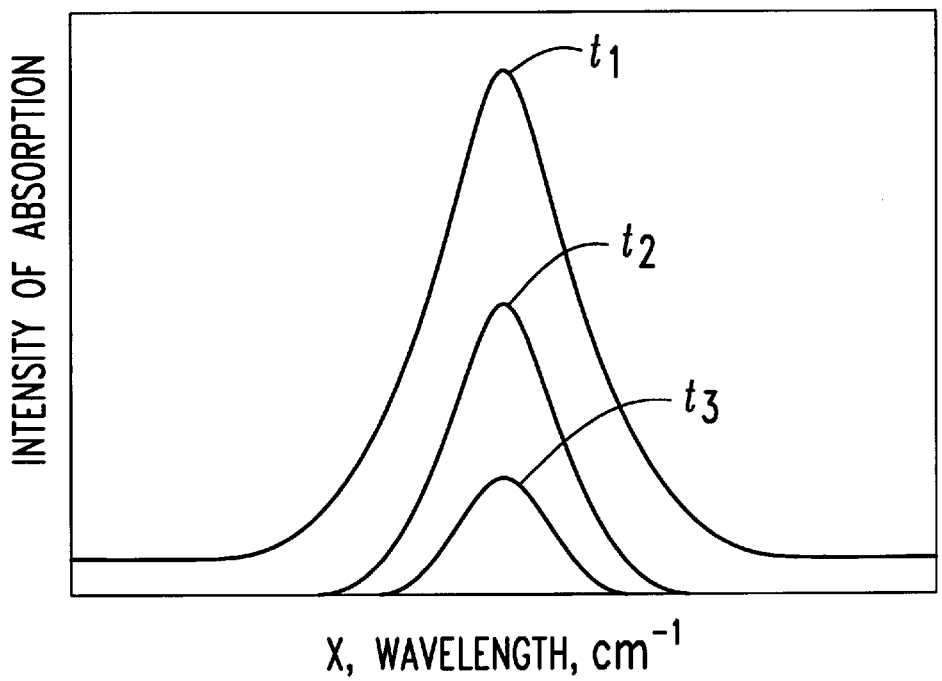
FIG. 3 illustrates the Intensity of Absorption of a reduction reaction by-product as a function of time.

In one embodiment, the reaction is monitored as illustrated in FIG. 3. In one particularly advantageous example, the infrared spectrophotometer monitors the intensity of one or more absorption bands of water (Symmetric stretch: ~3657 $cm^{-1}$, anti-symmetric stretch: ~3756 $cm^{-1}$, bend: ~1595 $cm^{-1}$). As FIG. 3 illustrates, the spectrophotometer detects water as the reduction reaction begins. When the reaction nears completion, the intensity of the absorption measured by the spectrophotometer decreases from $t_1$ to $t_3$. The x-axis indicates the wavelength of a byproduct of the reduction reaction. Over time, the wavelength will change, and it can either increase or decrease depending on whether the byproduct increase or decreases in concentration with time. Fore example, in the case of $Cu_2O$ reduction using $H_2$, the byproduct will be $H_2O$, which will decrease in concentration with time as the $Cu_2O$ is reduced to Cu. In a region of FIG. 3 where the signal intensity approaches the background level, the reduction of oxidized portions 75 is complete and pitting of the conductive material 70 is absent. Once completed, the reaction is quenched by methods known to those skilled in the art.

Figure 4:
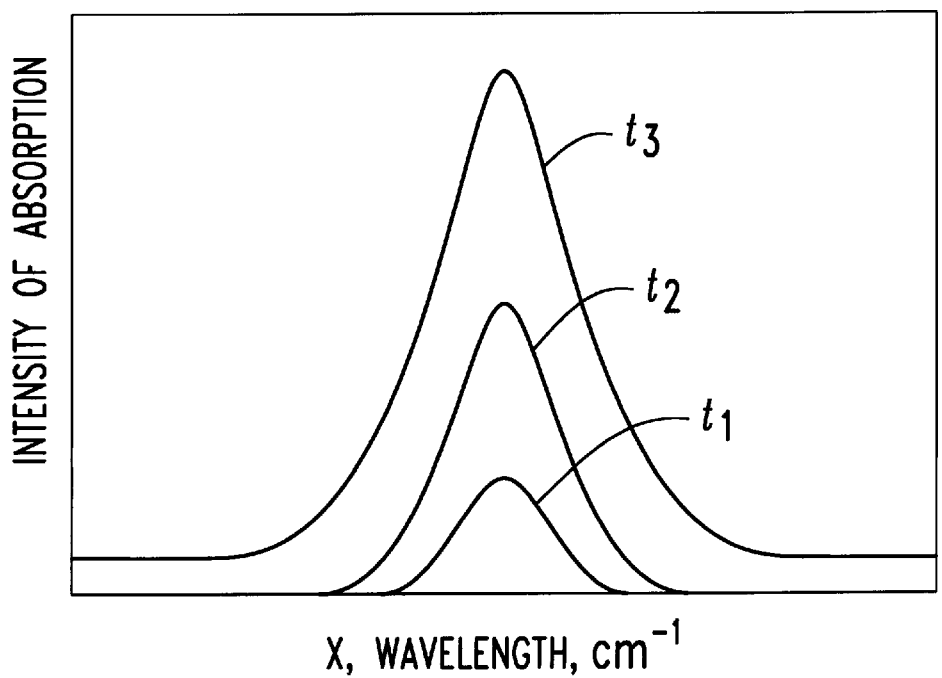
FIG. 4 illustrates the Intensity of Absorption of the reducing agent as a function of time.

In another embodiment, a physical characteristic of the reducing agent is monitored, as illustrated in FIG. 4, which is the reverse of FIG. 3. In this figure, ammonia or hydrogen is first consumed at a high rate and the consumption rate decreases with time as $Cu_2O$ is full reduced to Cu. The spectrophotometer is programmed to monitor one or more absorption bands of ammonia (Symmetric stretch: ~3337 cm$^{-1}$, anti-symmetric stretch: ~3444 cm$^{-1}$, degenerate deformation: ~1627 cm$^{-1}$). As indicated in FIG. 4, when the reaction nears completion, the intensity of the absorption measured by the spectrophotometer increases from $t_1$ to $t_3$, thereby indicating that the reduction of the oxidized portions is also nearing completion. However, when the reduction is complete, the signal monitored by the spectrophotometer may not decrease to background levels as in the previous embodiment. Again, once the reduction is complete, the reaction is quenched by methods known in the art.

Based on the foregoing, it is readily apparent that the present invention is particularly useful in the fabrication of a semiconductor device, and indeed, another aspect of the invention provides for a semiconductor device wherein it includes an integrated circuit, such as a CMOS transistor, an NMOS transistor, a PMOS transistor, or a bi-polar transistor.

Although the present invention has been described in detail, those skilled in the art should understand that they can make various changes, substitutions and alterations herein without departing from the spirit and scope of the invention in its broadest form.

What is claimed is:

1. A method of determining an endpoint of a reduction reaction of a metal deposited on a semiconductor wafer, comprising:
   reducing an oxidized portion of the metal by subjecting the oxidized portion to a reducing agent that forms a reduction by-product; and
   detecting the endpoint of the reduction reaction by monitoring a physical characteristic of either the reducing agent or the reduction by-product.

2. The method as recited in claim 1 wherein reducing an oxidized portion includes reducing a copper oxide.

3. The method as recited in claim 2 wherein the copper oxide is copper (II) oxide, $Cu_2O$.

4. The method as recited in claim 1 wherein reducing an oxidized portion includes reducing with ammonia.

5. The method as recited in claim 1 further comprises oxidizing the metal in the presence of oxygen.

6. The method as recited in claim 1 wherein the reduction reaction by-product comprises a gaseous species.

7. The method as recited in claim 1 wherein the reduction reaction by-product comprises water.

8. The method as recited in claim 1 wherein detecting an endpoint includes detecting an endpoint with a spectrophotometer.

9. The method as recited in claim 8 wherein the spectrophotometer is an infrared spectrophotometer.

10. The method of claim 8 wherein the spectrophotometer is an UV-visible spectrophotometer.

11. The method as recited in claim 1 wherein detecting an endpoint includes monitoring a physical characteristic of the reducing agent.

12. The method as recited in claim 1 wherein detecting an endpoint includes monitoring a physical characteristic of the reaction by-product.

13. A method of fabricating a semiconductor device, comprising:
   forming active device regions on a semiconductor wafer;
   forming a metal within the semiconductor device, an oxidized portion of the metal forming during an intermediate phase of the fabrication of the semiconductor device;
   reducing the oxidized portion by subjecting the oxidized portion to a reducing agent that forms a reduction by-product;
   detecting an endpoint of the reduction reaction by monitoring a physical characteristic of either the reducing agent or the reduction by-product; and
   completing the fabrication of the semiconductor device.

14. The method of claim 13 wherein forming a metal over a portion of the semiconductor wafer includes forming an interconnect.

15. The method of claim 14 wherein forming an interconnect includes forming a contact plug.

16. The method of claim 14 wherein forming an interconnect includes forming a line.

17. The method as recited in claim 13 wherein reducing an oxidized portion includes reducing a copper oxide.

18. The method as recited in claim 17 wherein reducing an oxidized portion includes copper (II) oxide, $Cu_2O$.

19. The method as recited in claim 13 where the reducing agent comprises ammonia.

20. The method as recited in claim 13 further comprising oxidizing the metal in the presence of oxygen.

21. The method as recited in claim 13 wherein the reduction reaction by-products comprise a gaseous species.

22. The method as recited in claim 21 wherein the gaseous species comprises water.

23. The method as recited in claim 13 wherein detecting an endpoint includes detecting an endpoint with a spectrophotometer.

24. The method as recited in claim 23 wherein the spectrophotometer is an infrared spectrophotometer.

25. The method of claim 23 wherein the spectrophotometer is an UV-visible spectrophotometer.

26. The method as recited in claim 13 wherein detecting an endpoint includes monitoring a physical characteristic of the reducing agent.

27. The method as recited in claim 13 wherein detecting an endpoint includes monitoring a physical characteristic of the reaction by-product.

* * * * *